(12) United States Patent
Hiratsuka et al.

(10) Patent No.: US 6,319,325 B1
(45) Date of Patent: Nov. 20, 2001

(54) APPARATUS FOR PRODUCING THIN FILM, PROCESS FOR PRODUCING THIN FILM AND GUIDE ROLLER

(75) Inventors: Ryoichi Hiratsuka; Kikuji Kawakami; Yoshihito Ebine; Atsuhiro Abe; Yukihiro Koshika, all of Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/505,185

(22) Filed: Feb. 16, 2000

(30) Foreign Application Priority Data

Feb. 26, 1999 (JP) .................................. P11-051069

(51) Int. Cl.⁷ ............................. C23C 16/00; H05H 1/00; B05D 1/00
(52) U.S. Cl. ..................... 118/718; 118/723 E; 156/345; 427/434.2; 427/585
(58) Field of Search ................... 118/718, 723 E, 118/723 R, 715, 52, 235, 68, 500; 156/345; 427/585, 434.2

(56) References Cited

U.S. PATENT DOCUMENTS 4,154,432 * 5/1979 Janatka et al. ................. 396/575
5,718,766 * 2/1998 Vignot et al. .................. 118/423

FOREIGN PATENT DOCUMENTS 11-176914-A * 7/1999 (JP) .................. H01L/21/68

* cited by examiner

*Primary Examiner*—Gregory Mills
*Assistant Examiner*—P. Hassanzadeh
(74) *Attorney, Agent, or Firm*—Sonnenschein, Nath & Rosenthal

(57) ABSTRACT

It is to provide an apparatus for producing a thin film, a process for producing a thin film and a guide roller, in which an arc resistant property is provided, and the film formation can be stably conducted with preventing damage of the thin film thus formed. In an apparatus for producing a thin film, such as a plasma CVD apparatus, comprising a vacuum chamber, means for generating a plasma in the vacuum chamber, means for introducing a gas to the vacuum chamber, and a guide roller for running a material to be treated by winding and supporting in the vacuum chamber, an outer peripheral surface of the guide roller in contact and sliding with the material to be treated comprises an electric conductor on both end parts in a width direction of the guide roller, and an electric insulator on a central part thereof.

10 Claims, 4 Drawing Sheets

APPARATUS FOR PRODUCING THIN FILM, PROCESS FOR PRODUCING THIN FILM AND GUIDE ROLLER

RELATED APPLICATION DATA

The present application claims priority to Japanese Application No. P11-051060 filed Feb. 26, 1999 which application is incorporated herein by reference to the extent permitted by law.

FIELD OF THE INVENTION

The present invention relates to an apparatus for producing a thin film, a process for producing a thin film and a guide roller utilizing a plasma reaction, and more particularly, it relates to an apparatus for producing a thin film, a process for producing a thin film and a guide roller, in which film characteristics of the thin film produced by using the guide roller have characteristic features.

BACKGROUND OF THE INVENTION

Examples of the fields of information recording, to which an apparatus for producing a thin film and a process for producing a thin film are applied, include a protective layer formed on a magnetic recording medium, such as a magnetic tape and a magnetic disk, used in particular as an information recording medium. Such a protective layer is demanded to have an increased throughput of the production process thereof and an increased wear resistance of the protective layer produced by the process. A conventional example of an apparatus for producing a thin film and a process for producing a thin film, which are applied to a magnetic recording medium, such as a magnetic tape, will be described below.

As a magnetic recording medium, a coating type magnetic recording medium has been widely employed, which is produced by coating a magnetic coating composition comprising a powder magnetic material, such as oxide magnetic powder and alloy magnetic powder, dispersed in an organic binder, such as a vinyl chloride-vinyl acetate series copolymer, a polyester resin, a urethane resin and a polyurethane resin, on a non-magnetic support, followed by drying.

Along with increase in demand for high density magnetic recording, on the other hand, a magnetic recording medium having a so-called metallic thin film type magnetic recording layer is being received attention, which is produced by directly adhering a metallic magnetic material, such as a Co-Ni alloy, a Co-Cr alloy and Co-O, on a non-magnetic support of a film form, such as polyethylene terephthalate (PET), polyester, polyamide and polyimide, by plating or vacuum thin film forming means (such as a vacuum deposition method, a sputtering method and an ion plating method).

In recent years, a magnetic tape, called a vapor deposition tape, comprising a metallic thin film type magnetic recording layer widely spreads to a field of a digital video cassette recorder and a field of a data streamer, such as AIT (Advanced Intelligence Tape, a trade name of Sony Corp.), and improvement in film characteristics of a protective layer of the magnetic tape is being earnestly demanded.

An example of a magnetic recording medium having a metallic thin film type magnetic recording layer will be described with reference to FIG. 1 showing a schematic cross sectional view of a magnetic recording medium.

In a magnetic recording medium 4, such as a magnetic tape, a metallic thin film type magnetic recording layer 7 comprising a ferromagnetic metal, such as Fe, Co and Ni, or a ferromagnetic alloy containing one of Fe, Co and Ni is formed on a non-magnetic support 5, such as a polyester film, by a thin film forming method, such as a vacuum deposition method, a sputtering method and an ion plating method. The magnetic recording layer and the non-magnetic support may be a single layer structure or a multi-layer structure. Furthermore, depending on necessity, an undercoating layer 6, a protective layer 8, such as those of hard carbon series, a lubricant layer 9 and a backcoating layer 10 are formed.

In the magnetic recording medium 4 having the metallic thin film type magnetic recording layer 7, as different from a coating type magnetic recording medium, because a binder as a non-magnetic material is not mixed in the magnetic recording layer 7 to increase the packing density of the magnetic material, it exhibits various advantages in that the coercive force and the squareness ratio are excellent, the recording demagnetization and the thickness loss on reproduction are extremely small, and the electromagnetic conversion characteristics at a short wavelength are excellent. That is, it is considered that the magnetic recording medium 4 having the metallic thin film type magnetic recording layer 7 becomes a main stream of high density magnetic recording owing to its excellent magnetic characteristics.

Furthermore, in order to improve the electro-magnetic conversion characteristics of the magnetic recording medium 4 of this type to obtain larger output, a so-called oblique vapor deposition method has been practiced, in which the magnetic recording layer 7 of the magnetic recording medium 4 is vapor-deposited in an oblique manner.

There is a tendency in that the surface of the magnetic recording medium 4 is being smoothed to decrease the spacing loss owing to the stream of increasing recording density. However, it brings about increase in frictional force between a magnetic head not shown in the figure and the magnetic recording medium 4, and increase in shearing stress formed in the magnetic recording medium 4.

In view of the background situation described above, a protective layer 8 is formed on the surface of the magnetic recording layer 7 of the magnetic recording medium 4 to decrease the friction coefficient between a magnetic head and the magnetic recording medium 4 and to increase the wear resistance characteristics.

As the protective layer 8, a carbon film, a quartz ($SiO_2$) film and a zirconia ($ZrO_2$) film have been studied, and some of them have been practically produced for a magnetic disk. In particular, a diamond-like carbon film (hereinafter referred to as a DLC film) having a higher hardness is formed as the protective layer 8 in recent years, which is expected to be a main stream. Application thereof to a magnetic tape, such as a vapor deposition tape, which is demanded to have sliding characteristics and environment resistance characteristics, is being studied.

As an apparatus for producing a thin film for producing the protective layer 8, a sputtering apparatus and a plasma CVD (chemical vapor deposition) apparatus are frequently employed. The apparatus for producing a thin film and the process for producing a thin film will be described below referring to a plasma CVD apparatus having an increased film formation rate thereof to improve the throughput.

In the plasma CVD apparatus, a step of forming a thin film is conducted, in which a chemical reaction of a gas as a raw material, such as decomposition and recombination, is conducted by utilizing the energy of plasma generated by an electric field or a magnetic field. While DC discharge and RF discharge are generally used as the plasma source in the plasma CVD apparatus, a method utilizing ECR (electron cyclotron resonance) is being studied.

As an example of the plasma CVD apparatus, the case where the protective layer 8 of the magnetic recording medium 4 in the form of a magnetic tape is produced by the plasma CVD apparatus of a DC discharge type will be described with reference to FIG. 2 showing a schematic cross sectional view of the plasma CVD apparatus.

In the plasma CVD apparatus 11 shown in FIG. 2, a protective film, such as a DLC film, is formed on a material to be treated 12, a magnetic recording medium, such as a magnetic tape. The material to be treated 12 is supplied from a supplying roller 14 while supporting by a pair of guide rollers 1 in a vacuum chamber 13, and supported with winding by a can roller 15 capable of rotating at a constant rate, which functions as a counter electrode and is equipped with a cooling mechanism. The material to be treated 12 is rotated and driven by the can roller 15, and run and stored by winding by a winding roller 16. The vacuum chamber 13 is evacuated to a prescribed atmosphere of a reduced pressure by a vacuum evacuation device 17.

A hydrocarbon series raw material gas introduced into a reaction tube 18 through gas inlet 19 is converted to a plasma with a DC electric field of from 500 to 2,000 V through an electrode 20 provided inside the reaction tube 18, and subjected to reactions, such as decomposition and recombination, to form a film, such as a carbon film, on the material to be treated 12 carried by the can roller 15. An electric power is supplied to the electrode 20 from a DC power source 21. The durability of a magnetic recording medium of the material to be treated 12 is considerably improved by forming the protective layer, such as a carbon film, by using the plasma CVD apparatus 11.

However, as shown in FIG. 3 showing a schematic cross sectional view of an important part of the plasma CVD apparatus, in the case where a film forming material having been plasma-decomposed by application of a high voltage is formed as a film on the material to be treated 12, a large electric current flows on the material to be treated 12 owing to the constitution of the apparatus.

The large electric current thus formed brings about, unless it is grounded, problems in that normal running of the material to be treated 12 becomes impossible, and in the case where the material to be treated 12 is in contact and sliding with the guide roller 1 made of a metal, arc discharge as small lightening discharge occurs to damage the material to be treated 12 itself (in the case where the material to be treated 12 is a magnetic recording medium, microdeformation of the magnetic layer and the non-magnetic support called pinhole type heat degradation frequently occurs). There is a further problem in that the problems become conspicuous when a higher voltage is applied (which is proportional to the film forming rate).

SUMMARY OF THE INVENTION

An object of the invention is to provide an apparatus for producing a thin film, a process for producing a thin film and a guide roller, in which an arc resistant property is provided, and the film formation can be stably conducted with preventing damage of the thin film thus formed.

The invention relates to an apparatus for producing a thin film comprising a vacuum chamber, means for generating a plasma in the vacuum chamber, means for introducing a gas to the vacuum chamber, and a guide roller for running a material to be treated by winding and supporting in the vacuum chamber, wherein an outer peripheral surface of the guide roller in contact and sliding with the material to be treated comprises an electric conductor on both end parts in a width direction of the guide roller, and an electric insulator on a central part in a width direction of the guide roller.

The invention also relates to a process for producing a thin film comprising a step of generating a plasma in an atmosphere of reduced pressure, a step of introducing a gas into the atmosphere of reduced pressure, and a step of running a material to be treated by winding and supporting with a guide roller, so as to produce a thin film on the material, wherein an outer peripheral surface of the guide roller in contact and sliding with the material to be treated comprises an electric conductor on both end parts in a width direction of the guide roller, and an electric insulator on a central part in a width direction of the guide roller.

It is preferred that the material to be treated is a magnetic recording medium, and the step of forming a thin film is a step of forming a protective layer on a magnetic recording layer of a magnetic recording medium.

It is preferred that the protective layer comprises one of carbon and diamond-like carbon.

In the apparatus for producing a thin film and the process for producing a thin film according to the invention, it is preferred that an electric current density at a contact and sliding part of the electric conductive part of the guide roller and the material to be treated is $20.5 \times 10^{-3}$ A/mm$^2$ or less.

The electric insulator preferably has an electric resistance of 10,000Ω or more.

It is preferred that the electric insulator is ceramics, and the electric conductor is stainless steel.

In the apparatus for producing a thin film and the process for producing a thin film according to the invention, it is preferred that a plasma CVD apparatus and a plasma CVD method are employed, respectively.

The guide roller according to the invention is used in the apparatus for producing a thin film according to the invention.

In the guide roller of the invention, the electric insulator preferably has an electric resistance of 10,000Ω or more, and it is preferred that the electric insulator is ceramics, and the electric conductor is stainless steel.

The function obtained by the means described above will be described below.

According to the apparatus for producing a thin film, such as a plasma CVD apparatus, and the process for producing a thin film having a guide roller of the invention having an electric insulator sandwiched by an electric conductor formed on the outer peripheral surface thereof, arc is concentrated at a contact and sliding part of the electric conductor of the guide roller and the material to be treated, such as a magnetic recording medium, but on the contrary, damages due to arc are prevented at a contact and sliding part of the insulator of the guide roller and the material to be treated, so as to stably produce a uniform thin film, such as a protective layer of a magnetic recording medium, having less defects and excellent film characteristics.

PREFERRED EMBODIMENTS OF THE INVENTION

Preferred embodiments of the invention will be described in detail below.

An apparatus for producing a thin film as an embodiment of the invention will be described with reference to FIG. 4, which is a schematic perspective view of a guide roller installed in the apparatus for producing a thin film, FIG. 5, which is a schematic perspective view showing the relationship between the guide roller and a material to be treated, FIG. 1, which is a schematic cross sectional view showing a related art magnetic recording medium, and FIG. 2, which is a schematic cross sectional view showing a plasma CVD apparatus.

Figure 1:
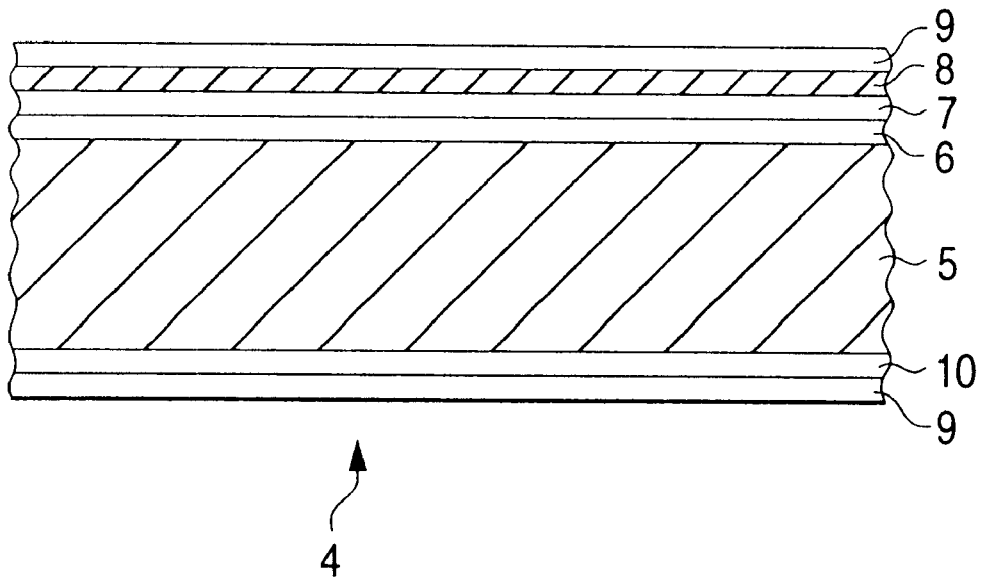
FIG. 1 is a schematic cross sectional view showing a conventional magnetic recording medium.
Figure 2:
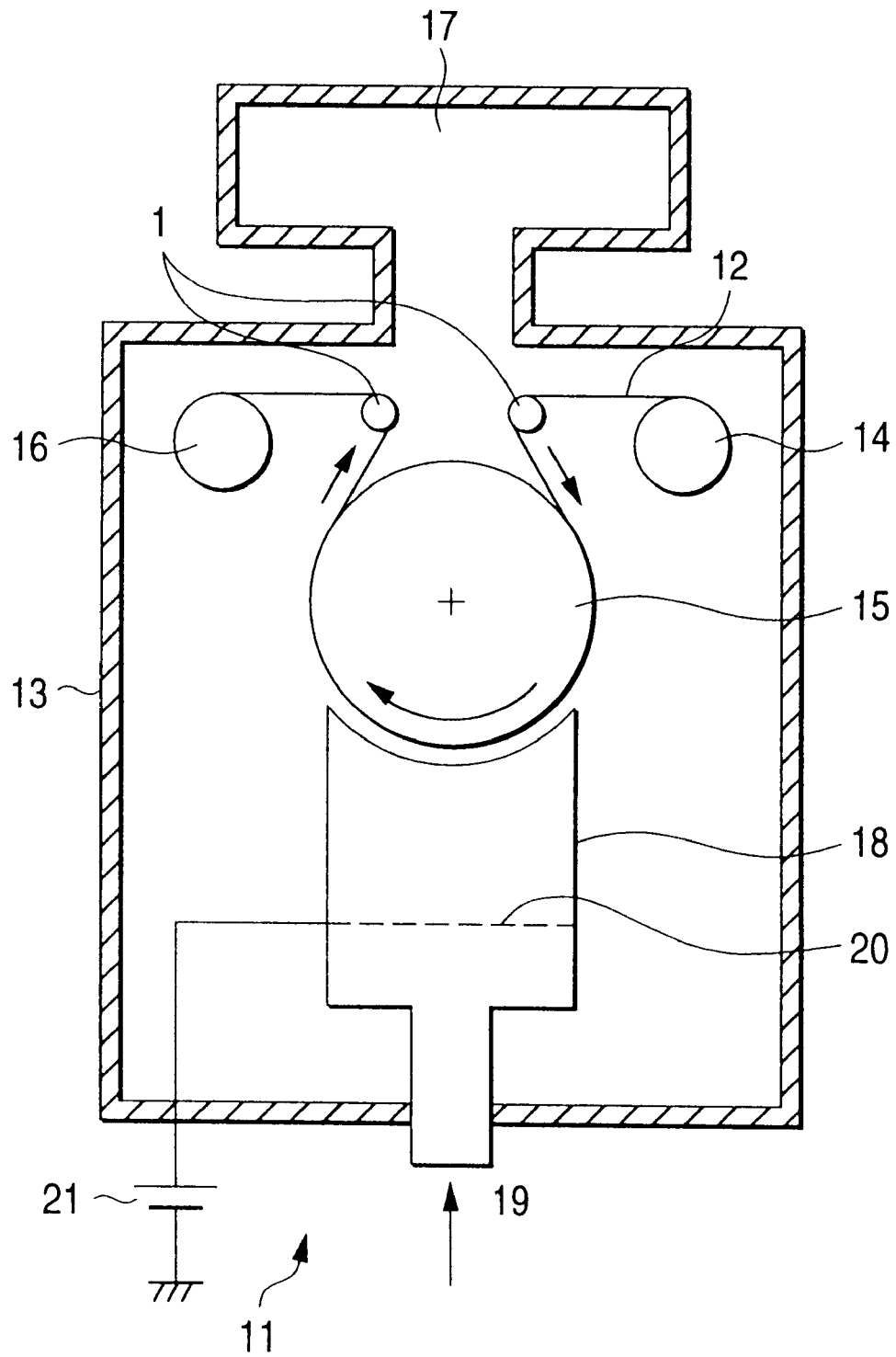
FIG. 2 is a schematic cross sectional view showing a conventional plasma CVD apparatus.
Figure 3:
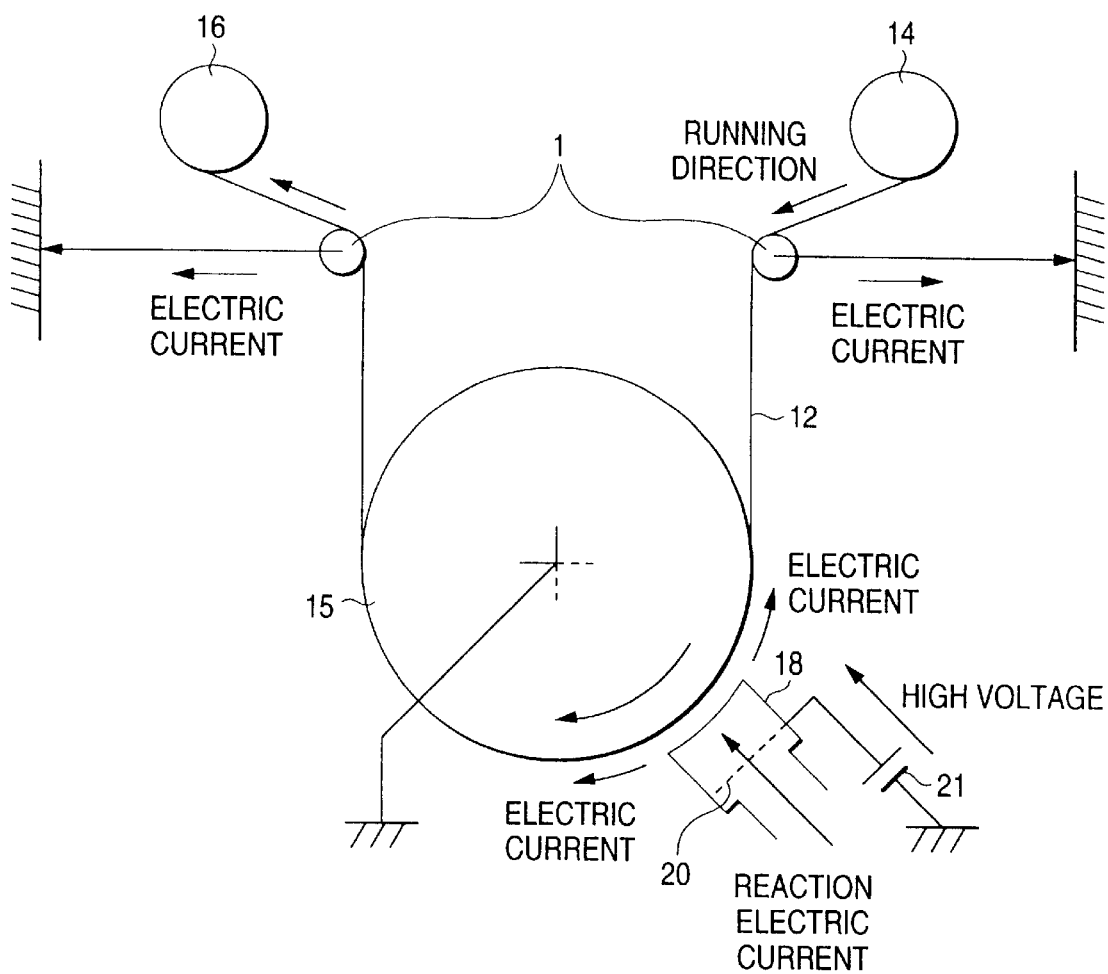
FIG. 3 is a schematic cross sectional view showing an important part of the conventional plasma CVD apparatus.

The constitution of the plasma CVD apparatus as an example of the apparatus for producing a thin film according to the invention is the same as the conventional plasma CVD apparatus 11 shown in FIG. 2 except for the guide roller 1 of the invention, and thus the detailed description thereof is omitted. The apparatus for producing a thin film is an example, in which a plasma CVD apparatus 11 of a DC discharge type is applied to the formation of a thin film of a magnetic recording medium, such as a magnetic tape. The apparatus employs a magnetic recording medium 4, such as the magnetic tape shown in FIG. 1, as the material to be treated 12, and forms a DLC film, for example, as the protective layer 8. The same symbols are attached to the same constitutional components as the conventional example.

Figure 4:
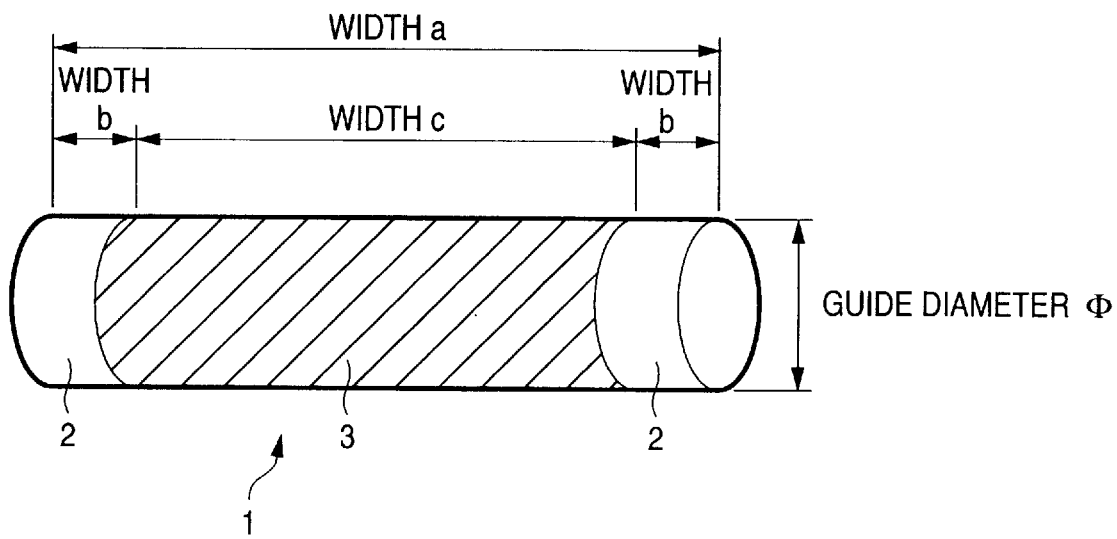
FIG. 4 is a schematic perspective view showing a guide roller according to the invention.

As shown in FIG. 4, the guide roller 1 is, for example, a stainless steel spindle having a cylindrical shape, the outer peripheral surface of which has a chrome plating, and has a guide diameter Φ and a guide width a. The outer peripheral surface of the cylindrical spindle has an electric conductor 2 having a width b on both end parts thereof, and on the central part, an electric insulator 3 having a width c and a thickness, for example, of 20 $\mu$m or more comprising, for example, Alumite (aluminum oxide) is formed by a thermal spraying method, and that comprising, for example, ceramics, such as alumina, is formed by a sputtering method or an electron beam vapor deposition method. Therefore, the guide roller 1 has such a structure that an outer peripheral surface of the guide roller 1 comprises the electric conductor 2 having a width b on both end parts in the direction of the width a of the guide roller, and the electric insulator 3 having a width c on the central part.

In the plasma CVD apparatus 11 shown in FIG. 2, the guide roller 1 is driven and is in contact and sliding with the material to be treated 12, such as a magnetic recording medium, in the relationship described below.

Figure 5:
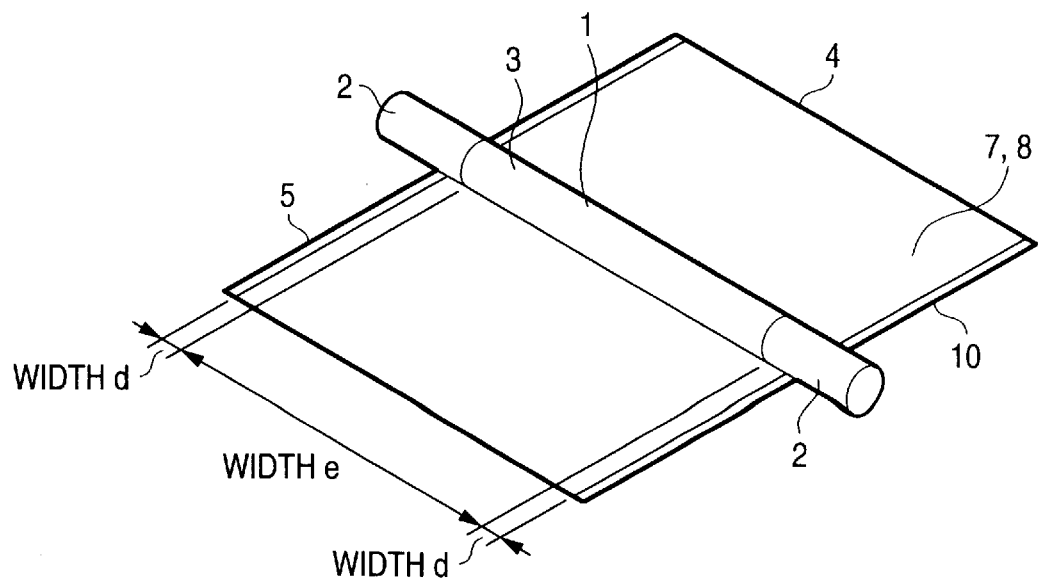
FIG. 5 is a schematic perspective view showing the relationship between a guide roller according to the invention and a material to be treated.

As shown in FIG. 5, the outer peripheral surface of the guide roller 1 is in contact sliding with the material to be treated, such as a magnetic recording material 4, in the following manner. The guide roller 1 supports the running magnetic recording medium 4 in such a manner that the electric conductor 2 on the both end parts is in contact and sliding with the non-magnetic support 5 and the magnetic recording layer 7 or the protective layer 8 formed in this apparatus, and the insulator 3 on the central part is in contact and sliding with the magnetic recording layer 7 or the protective layer 8 formed in this apparatus.

Accordingly, in the plasma CVD apparatus 11, the material to be treated 12, such as a magnetic recording medium, runs while being supported by the can roller 15 through the guide rollers 1, and a protective layer, such as a DLC film, is formed on the side of the material to be treated 12, where the thin film is formed.

In order for a specific example, to which the invention applied, and a comparative example to be compared with the example, a magnetic tape as an example of the magnetic recording medium 4 shown in FIG. 1 is exemplified, and the case where a protective layer 8, such as a DLC film, is formed on the magnetic recording layer 7 of the magnetic tape in the plasma CVD apparatus described above will be described below. The structure of the magnetic tape is conformed to the constitution of a general metallic thin film type magnetic recording medium 4.

As an example of the magnetic recording medium 4, an emulsion solution having dispersed therein a water-soluble latex mainly comprising an acrylic ester was coated on one primary surface of a non-magnetic support 5 comprising a PET (polyethylene terephthalate) film having a thickness of 6 $\mu$m and a width of 127 mm, and a magnetic recording layer 7 was formed by a continuous winding vapor deposition apparatus of a reel-to-reel type on a surface of the support, on which surface protrusions were formed in a particle density of 1,000 per square millimeter.

The formation of the magnetic recording layer 7 was conducted, for example, by an oblique vapor deposition method of a Co alloy by an electron beam, in which a partially oxidized ferromagnetic metallic thin film was formed on the non-magnetic support comprising a PET film with introducing an oxygen gas. The film formation conditions were as follows:

| | |
|---|---|
| Composition of magnetic recording layer | Co100 single layer |
| Thickness of magnetic recording layer | 200 nm |
| Width of vapor deposition of magnetic recording medium | 100 mm |
| Incident angle | 35 to 60° |
| Introduced gas | Oxygen gas |
| Vacuum degree on vapor deposition | $2 \times 10^{-2}$ Pa |

As the plasma CVD conditions where the protective film 8 of a DLC film was formed on the magnetic recording layer 7, the following conditions, for example, were employed:

| | |
|---|---|
| Introduced gas | Ethylene + Argon |
| Gas proportion | $C_2H_4/Ar = 4/1$ |
| Total flow rate | 150 sccm |
| Reaction pressure | 30 Pa |
| Applied voltage | DC 1.2 kV |
| DLC film thickness | 9 nm |

According to the production conditions described above, raw fabric samples of 10 kinds of magnetic tapes were produced while varying the constitutional conditions, such as the structure, the number, the guide diameter $\Phi$ and the width of the insulator 3 of the guide roller 1 in contact and sliding with the magnetic recording layer 7, and the angle formed by the magnetic recording medium 4 and the guide roller 1.

The production conditions of Examples 1 to 8 and Comparative Examples 1 and 2 are shown in Table 1.

on the other primary surface (back surface) of the PET film. The coating composition for the coating type backcoating layer 10 was, for example, as follows:

| | |
|---|---|
| Carbon particles (Carbon Black #60 produced by Asahi Carbon Co., Ltd.) | 100 parts by weight |
| Organic binder (main component: polycarbonate) | 100 parts by weight |
| Solvent (methyl ethyl ketone/toluene/cyclohexane = 2/2/1) | 250 parts by weight |

The composition was mixed in a ball mill, and 5 parts by weight of a hardening agent (Coronate L) was added thereto immediately before coating. The coating composition was coated by a gravure coater to a dry thickness of 0.5 μm.

Subsequently, a lubricant layer 9 was formed by coating a toluene solution of a compound having a fluorocarbon primary skeleton that was modified to have a dimethyldecylamine structure.

Thereafter, the raw fabric samples were slit into a 6.35 mm width and installed in a cassette to produce magnetic tapes of Examples and Comparative Examples.

The samples of the magnetic tapes thus obtained were measure for dropout (hereinafter referred to as DO) and evaluated.

In the evaluation, the sample tape was run on a video tape recorder (VTR) under conditions of normal temperature and normal humidity and measured for DO, where the DO size was evaluated with a gate of −6 dB and 10 μs. The DO measurement system not shown in the figures had a constitution in that recording and reproduction were conducted with the magnetic tape samples on a VTR, and the repro-

TABLE 1

| | | Constitution of guide roller | | | |
|---|---|---|---|---|---|
| | Number | Structure | Guide diameter $\Phi$ (mm) | Angle* (°) | Width c of insulator (mm) |
| Example 1 | Inlet 1/outlet 1 | Stainless steel/Ceramics/Stainless steel | 20 | 60 | 86 |
| Example 2 | Inlet 1/outlet 1 | Stainless steel/Ceramics/Stainless steel | 30 | 60 | 86 |
| Example 3 | Inlet 1/outlet 1 | Stainless steel/Ceramics/Stainless steel | 100 | 60 | 86 |
| Example 4 | Inlet 1/outlet 1 | Stainless steel/Ceramics/Stainless steel | 20 | 10 | 86 |
| Example 5 | Inlet 1/outlet 1 | Stainless steel/Ceramics/Stainless steel | 20 | 60 | 78 |
| Example 6 | Inlet 1/outlet 1 | Stainless steel/Ceramics/Stainless steel | 20 | 60 | 93 |
| Example 7 | Inlet 1/outlet 1 | Stainless steel/Ceramics/Stainless steel | 20 | 10 | 86 |
| Example 8 | Inlet 1/outlet 1 (insulated guide 1) | Stainless steel/Ceramics/Stainless steel | 20 | 10 | 86 |
| Comparative Example 1 | Inlet 1/outlet 1 | Stainless steel | 20 | 60 | none |
| Comparative Example 2 | Inlet 1/outlet 1 | Ceramics | 20 | 60 | 100 |

(*)Angle: Angle formed by magnetic recording medium and guide roller

After forming the protective layer 8 on the raw fabric samples of the magnetic tapes of Examples and Comparative Examples, a coating type backcoating layer 10 was formed duced signal on an oscilloscope was subjected to measurement of number of DO by a DO counter.

The VTR used for evaluation of DO was DCR-VX1000 (produced by Sony Corp.), and the DO counter was VH06AZ (produced by ShibaSoku Co., Ltd.). The DO was measured in such a manner that a mono-frequency (wavelength: 1 μm) was recorded on the magnetic tapes of Examples and Comparative Examples, and reproduction output from them was inputted into the oscilloscope and the DO counter to measure the number of DO.

The results of evaluation are shown in Table 2. When the number of DO (−6 dB, 10 μs) is 50 per minute or less, it does not adversely affect image quality or sound quality.

width d, and the width e of the normal part is ensured at the contact part between the central part of the guide roller 1 and the material to be treated 12.

Furthermore, when the electric current density on the material to be treated 12 in contact and sliding with the conductor 2 becomes large, arc is formed on the other part than the conductor part 2 to increase DO as in Example 8, but according to the invention, the stable film formation can be conducted when the electric current density is $20.5 \times 10^{-3}$ (A/mm$^2$) or less.

It is understood from Example 7 that when the electric resistance of the insulator 3 of the guide roller 1 is 5,000Ω,

TABLE 2

| | Average value of DO measurement (6dB, 10 μs) | | | |
|---|---|---|---|---|
| | Electric current density at part of material to be treated in contact and sliding with conductor part $10^{-3}$ (A/mm$^2$) | At part of material to be treated in contact and sliding with conductor part of guide roller (number per minute) | At part of material to be treated in contact and sliding with insulator part of guide roller (number per minute) | Remarks |
| Example 1 | 3.4 | 186.0 | 3.0 | |
| Example 2 | 2.3 | 189.0 | 4.5 | |
| Example 3 | 0.68 | 150.0 | 2.9 | |
| Example 4 | 20.5 | 203.0 | 15.0 | |
| Example 5 | 2.2 | 153.0 | 12.5 | |
| Example 6 | 6.8 | 223.0 | 4.1 | |
| Example 7 | 20.5 | 133.0 | 116.0 | |
| Example 8 | 41.0 | 299.0 | 95.0 | |
| Comparative Example 1 | 0.48 | 463.0 | — | Arc was frequently formed with respect to guide rollers. |
| Comparative Example 2 | — | — | Impossible to measure | Arc was frequently formed with respect to reaction tube, and base was broken. (Film formation could not be continued.) |

It is understood from the results shown in Table 2 that, in Comparative Example 1, in which the surface structure of the outer peripheral surface of the guide roller 1 comprises only stainless steel, arc is frequently formed and a large number of DO is formed.

In Comparative Example 2, in which the surface structure of the outer peripheral surface of the guide roller 1 comprises only ceramics (having an electric resistance of 10,000Ω), arc is frequently formed, which causes breakage of the material to be treated, and thus stable film formation cannot be conducted.

It is understood from the results of Examples 1 to 6 that when the surface structure of the outer peripheral surface of the guide roller 1 comprises a structure of conductor 2/insulator/conductor 2, i.e., stainless steel/ceramics/stainless steel, heat degradation due to arc is not formed at the contact part between the insulator 3 of the guide roller 1 and the material to be treated 12 (magnetic recording medium 4) except for the contact part between the conductor 2 of the guide roller 1 and the material to be treated 12, and the value of DO is advantageously small. This is because as shown in FIG. 5, the electric current is concentrated at the contact part between the conductor parts 2 at the both ends of the guide roller 1 and the material to be treated 12 to localize the abnormal part of heat degradation within the arc is formed even at the contact part between the insulator 3 and the material to be treated 12 to increase the value of DO, and no effect is obtained by using the constitution of conductor 2/insulator 3/conductor 2.

According to the apparatus for producing a thin film and the process for producing a thin film of the invention, an apparatus for producing a thin film, such as a plasma CVD apparatus, equipped with a guide roller comprising a conductor at the both end of the outer peripheral surface thereof and an insulator at the central part thereof is employed, and thus the film formation can be conducted with stable film characteristics while preventing heat degradation of the thin film obtained. When a diamond-like carbon film, for example, is formed as a protective film of a magnetic recording medium, such as a magnetic tape, according to the process for producing a thin film, the film characteristics of the thin film obtained can be improved.

What is claimed is:

1. An apparatus for producing a thin film comprising a vacuum chamber;

means for generating a plasma in said vacuum chamber;

means for introducing a gas to said vacuum chamber; and a guide roller for running a material to be treated by winding and supporting in said vacuum chamber, wherein an outer peripheral surface of said guide roller in contact and sliding with said material to be treated comprises an electric conductor on both end parts in a width direction of said guide roller, and an electric insulator on a central part in a width direction of said guide roller.

2. An apparatus for producing a thin film as claimed in claim 1, wherein an electric current density at a contact and sliding part of said electric conductive part of said guide roller and said material to be treated is $20.5 \times 10^{-3}$ A/mm$^2$ or less.

3. An apparatus for producing a thin film as claimed in claim 1, wherein said electric insulator has an electric resistance of 10,000Ω or more.

4. An apparatus for producing a thin film as claimed in claim 1, wherein said electric insulator comprises ceramics.

5. An apparatus for producing a thin film as claimed in claim 1, wherein said electric conductor comprises stainless steel.

6. An apparatus for producing a thin film as claimed in claim 1, wherein said apparatus for producing a thin film is a plasma CVD apparatus.

7. A guide roller used in an apparatus for producing a thin film claimed in claim 1.

8. A guide roller as claimed in claim 7, wherein said electric insulator has an electric resistance of 10,000Ω or more.

9. A guide roller as claimed in claim 7, wherein said electric insulator comprises ceramics.

10. A guide roller as claimed in claim 7, wherein said electric conductor comprises stainless steel.

* * * * *